United States Patent
Kim et al.

(10) Patent No.: US 8,044,573 B2
(45) Date of Patent: Oct. 25, 2011

(54) ORGANIC LIGHT EMITTING DISPLAY AND METHOD OF MANUFACTURING THE SAME

(75) Inventors: Tade-woong Kim, Suwon-si (KR); Kyu-sung Lee, Suwon-si (KR); Hyo-jin Kim, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 213 days.

(21) Appl. No.: 12/213,752

(22) Filed: Jun. 24, 2008

(65) Prior Publication Data

US 2009/0021157 A1  Jan. 22, 2009

(30) Foreign Application Priority Data

Jul. 18, 2007  (KR) .................. 10-2007-0071710

(51) Int. Cl.
*H01J 1/62* (2006.01)
*H01J 63/04* (2006.01)

(52) U.S. Cl. ........ 313/504; 313/498; 313/506; 313/512; 313/238

(58) Field of Classification Search .......... 313/498–512, 313/238
See application file for complete search history.

(56) References Cited

U.S. PATENT DOCUMENTS

| | | |
|---|---|---|
| 7,187,006 B2 | 3/2007 | Hayashi |
| 2005/0023966 A1 | 2/2005 | Suh et al. |
| 2005/0067950 A1 | 3/2005 | Nonoue et al. |
| 2007/0182314 A1* | 8/2007 | Oh et al. .................. 313/500 |

FOREIGN PATENT DOCUMENTS

| | | |
|---|---|---|
| JP | 2004-311421 | 11/2004 |
| KR | 10-2004-0086556 A | 10/2004 |
| KR | 10-2004-0106808 A | 12/2004 |
| KR | 10-2005-0013870 A | 2/2005 |
| KR | 10-2006-0084978 A | 7/2006 |

* cited by examiner

*Primary Examiner* — Joseph L Williams
*Assistant Examiner* — Kevin Quarterman
(74) *Attorney, Agent, or Firm* — Lee & Morse, P.C.

(57) ABSTRACT

An organic light emitting display includes a substrate, an organic light emitting device on the substrate, the organic light emitting device including a first electrode, an organic emitting layer, and a second electrode, a UV light shielding layer having at least two layers, each layer absorbing different wavelengths of UV light, and an encapsulation layer sealing the organic light emitting device.

15 Claims, 6 Drawing Sheets

ORGANIC LIGHT EMITTING DISPLAY AND METHOD OF MANUFACTURING THE SAME

BACKGROUND OF THE INVENTION

1. Field of the Invention

Embodiments relate to an organic light emitting display and a method of manufacturing the same. More particularly, embodiments relate to an organic light emitting display capable of preventing electrical characteristics from deteriorating due to ultraviolet (UV) light and a method of manufacturing the same.

2. Description of the Related Art

An organic light emitting display is a next generation display having a self-emission characteristic and improved view angle, contrast, response speed, and power consumption than a liquid crystal display (LCD).

The organic light emitting display includes an organic light emitting diode (OLED) coupled between scan lines and data lines by a matrix method to construct a pixel. The OLED includes an anode electrode, a cathode electrode, and an organic emitting layer formed between the anode electrode and the cathode electrode. The organic emitting layer includes a hole transport layer, an organic light emitting layer, and an electron transport layer. When a predetermined voltage is applied to the anode electrode and the cathode electrode, holes injected through the anode electrode and electrons injected through the cathode electrode are recombined in the light emitting layer, which, in turn, emits light in response thereto.

The organic material in the OLED is vulnerable to hydrogen and/or oxygen. Further, the cathode electrode is easily oxidized by moisture, deteriorating electrical and light emitting characteristics. In order to prevent the electrical and light emitting characteristics from deteriorating, a can or cup shaped container made of a metal material or a sealing substrate made of glass or plastic is provided to face a substrate on which the OLED is formed. Then, sealing is performed using a sealant, e.g., an epoxy.

However, use of such a container or sealing substrate with an OLED to be used in a thin or flexible display is impractical. Therefore, in order to seal the thin or flexible display, a thin film encapsulation technology is provided.

As an example of the thin film encapsulation, a method of alternately laminating an inorganic layer and an organic layer to form an encapsulation layer is widely used, as this satisfies a water vapor transmission (WVTR) condition of about $\sim 10^{-6}$ g/m²/day required by the display. However, such formation includes providing an evaporation depositing liquid monomer and curing the evaporation deposited liquid monomer using UV light to form a polymer. As a result, the UV light is incident on the organic emitting layer. When UV light is incident on the organic emitting layer, thermal damage is generated to change the characteristics of the organic emitting layer and surface characteristics between the organic emitting layer and the cathode electrode, so that the electrical characteristics (I-V) of the OLED are positively shifted and/or a leakage current is generated, increasing power consumption and reducing the life of the OLED.

Figure 1:
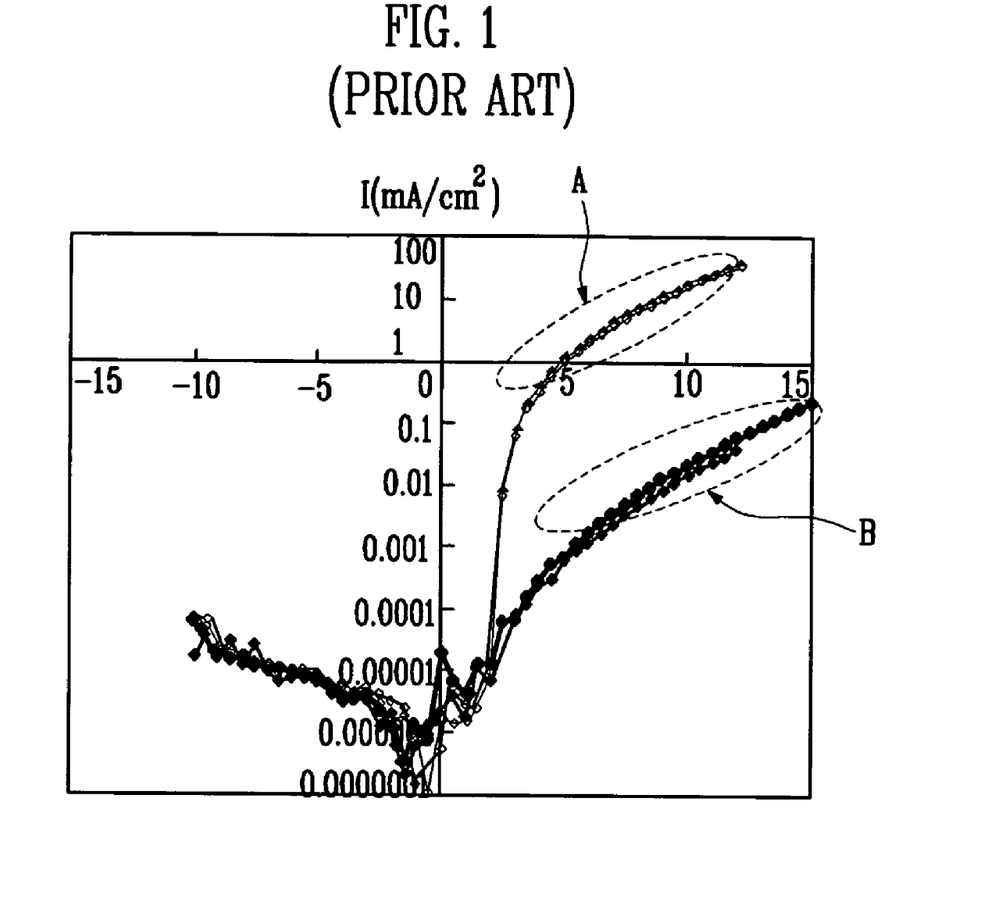
FIG. 1 illustrates a change in the electrical characteristics (I-V) of an organic light emitting device caused by UV light.

FIG. 1 illustrates a graph of a change in the electrical characteristics (I-V) of the OLED as a result of incident UV light. Curve A illustrates a measurement result before the UV light is incident and curve B illustrates a measurement result after the UV light is incident. When the electrical characteristic (I-V) changes, a higher voltage is required in order to maintain the brightness (cd).

SUMMARY OF THE INVENTION

Embodiments are therefore directed to providing an organic light emitting display and method of manufacturing the same, which substantially overcomes one or more of the disadvantages noted above regarding the related art.

Therefore, it is a feature of an embodiment to provide an organic light emitting display capable of preventing a change in the electrical characteristics of an organic light emitting device that are caused by ultraviolet (UV) light and a method of manufacturing the same.

At least one of the above and other features and advantages may be realized by providing an organic light emitting display, including a substrate, an organic light emitting device on the substrate, the organic light emitting device including a first electrode, an organic emitting layer, and a second electrode, a UV light shielding layer on the organic light emitting device, the UV light shielding layer including at least two layers, each layer absorbing different wavelengths of UV light, and an encapsulation layer sealing the organic light emitting device.

A first wavelength absorbed by a lower layer of the two layers may be longer than a second wavelength absorbed by an upper layer thereof. Each of the two layers may include one of resorcinol monobenzoate, benzophenone, benzotriazole, cinnamate, oxanilide, and salicylate.

The encapsulation layer may include a UV curable material. UV light used to cure the UV curable material may have a wavelength between about 200 nm to about 400 nm. The UV light shielding layer may shield UV light including wavelengths of UV light used to cure the UV curable material. The encapsulation layer includes an organic film and an inorganic film.

The organic light emitting may include a thin film transistor on the substrate and coupled with the first electrode.

At least one of the above and other features and advantages may be realized by providing a method of fabricating an organic light emitting display, including forming an organic light emitting device on the substrate, forming a UV shielding layer on the organic light emitting device, the UV light shielding layer including at least two layers, each of which absorb different wavelengths of UV light, and forming an encapsulation layer on the UV shielding layer.

A wavelength absorbed by a lower layer of the at least two layers is longer than a wavelength absorbed by an upper layer thereof. Each of the two layers may include one of resorcinol monobenzoate, benzophenone, benzotriazole, cinnamate, oxanilide, and salicylate.

Forming the encapsulation layer may include UV curing a UV light curable material. UV light used for UV curing may have a wavelength of about 200 nm to about 400 nm. The UV light shielding layer may shield UV light including wavelengths of UV light used to cure the UV curable material.

Forming the encapsulation layer may include forming an organic film and an inorganic film. Forming the organic film and the inorganic film may include laminating the inorganic film on the organic film.

Forming the UV shielding layer may include laminating a first layer of the at least two layers on the second electrode and laminating a second layer of the at least two layers on the first layer.

The method may include forming a thin film transistor on the substrate, the thin film transistor being coupled to the organic light emitting device. Forming the thin film transistor may include forming a semiconductor layer on the substrate, forming a gate insulation layer on the substrate including the semiconductor layer, forming a gate electrode on the gate insulation layer and the semiconductor layer, forming an interlayer insulation layer on the gate electrode and the gate insulation layer, the interlayer insulation layer including contact holes exposing the semiconductor layer, forming source and drain electrodes contacting the semiconductor layer through the contact holes, and forming a via hole to expose the source electrode or the drain electrode after forming a planarization layer on the entire upper surface. Forming the organic light emitting device may include forming a first electrode coupled with the source electrode or the drain electrode through the via hole, exposing the first electrode of a light emitting region after forming a pixel definition layer on the entire upper surface, and forming an organic emitting layer on the exposed first electrode and forming a second electrode on the pixel definition layer including the organic emitting layer.

Forming the organic light emitting device may include forming first electrodes arranged on a substrate in a first direction, forming an insulation layer including openings such the first electrode in a light emitting region is exposed, forming an organic emitting layer on the insulation layer including the first electrodes, and forming a second electrode crossing the first electrodes of the light emitting region.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION OF THE INVENTION

Korean Patent Application No. 10-2007-0071710, filed on Jul. 18, 2007, in the Korean Intellectual Property Office, and entitled: "Organic Light Emitting Display and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of:" For example, the expression "at least one of A, B, and C" may also include an nth member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

Figure 2:
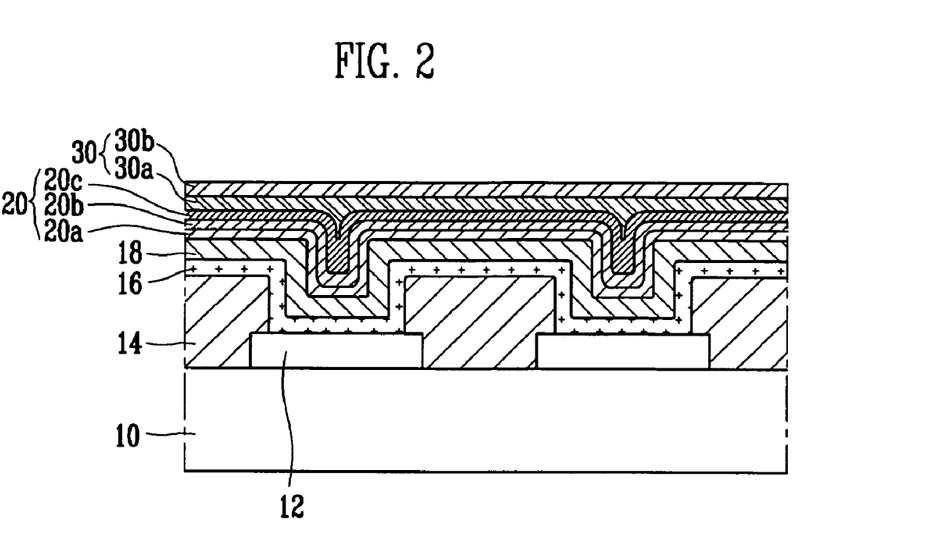
FIG. 2 illustrates a cross-sectional view of an organic light emitting display according to a first embodiment of the present invention.

FIG. 2 illustrates a sectional view of an organic light emitting display according to a first embodiment of the present invention as an example of a passive matrix type organic light emitting display The passive matrix type organic light emitting display according to the first embodiment may include an organic light emitting diode (OLED) on a substrate 10, an UV shielding layer 20, e.g., a laminated structure of substances having different absorption wavelengths, on the OLED, and an encapsulation layer 30 on the UV shielding layer 20 for sealing the OLED.

The OLED may include an anode electrode 12 on the substrate 10 in a first direction, a cathode electrode 18 in a second direction, orthogonal to the anode electrode 12, and an organic emitting layer 16 between the anode electrode 12 and the cathode electrode 18. The organic emitting layer 16 may include a hole transport layer, an organic light emission layer, and an electron transport layer laminated on one another. The organic emitting layer 16 may further include a hole injection layer and an electron injection layer. An insulation layer 14 may be on the substrate 10 where the anode electrode 12 is not present and may partially cover the anode electrode 12, and may extend up to the organic emitting layer 16.

The UV light shielding layer 20 may include layers of materials having different absorption wavelengths. For example, the UV light shielding layer 20 may include a material 20a absorbing UV light of a first wavelength, a material 20b absorbing UV light of a second wavelength, and a material 20c absorbing UV light of a third wavelength. These layers may be laminated. While a three layer structure absorbing different wavelengths of UV light is shown in the FIG. 2, embodiments are not limited thereto. For example, a multilayer structure of no less than two layers may be formed. In order to shield of light over a wide wavelength range, the second wavelength may be larger than the third wavelength, the first wavelength may be larger than the second wavelength, and the first, second, and third wavelengths may each be a single wavelength, a plurality of wavelengths, or a range of wavelengths, in accordance with a material.

The encapsulation layer 30 may include an organic film 30a and an inorganic film 30b. Although only a dual layer of the organic film 30a and the inorganic film 30b is illustrated in FIG. 2, embodiments are not limited thereto. For example, the encapsulation layer 30 may be a multi-layer structure having more than two layers.

Figure 3:
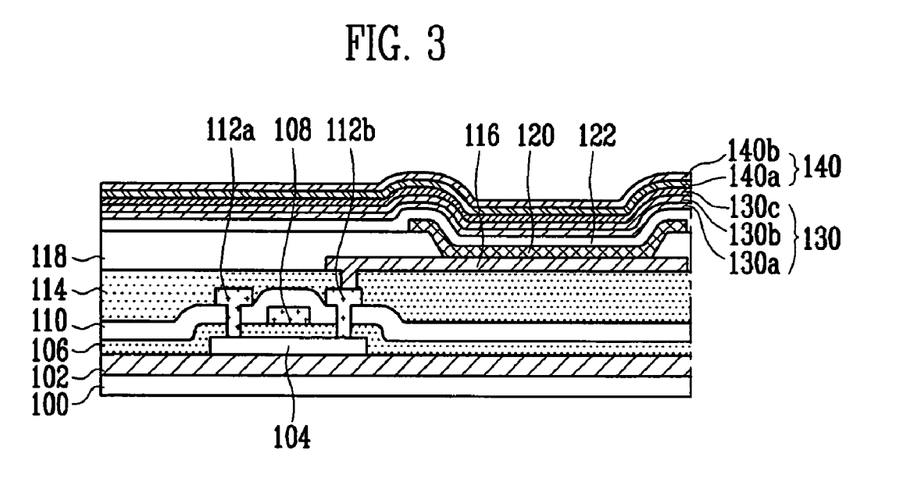
FIG. 3 illustrates a cross-sectional view of an organic light emitting display according to a second embodiment of the present invention.

FIG. 3 illustrates a cross-sectional view of an organic light emitting display according to a second embodiment of the present invention as an example of an active matrix type organic light emitting display, in which respective pixels are controlled by a thin film transistor (TFT).

The active matrix type organic light emitting display may include a TFT on a substrate 100, an organic light emitting diode (OLED) coupled with the TFT, a UV light shielding layer 130, e.g., in the form of a laminated structure of substances with different UV light absorbing wavelengths, on the OLED, and an encapsulation layer 140 for sealing the OLED.

The TFT may include a semiconductor layer 104 having a channel region and a source and drain region, a gate electrode 108 on the semiconductor layer 104 in the channel region and insulated from the semiconductor layer 104 by an insulation layer 106, and source and drain electrodes 112a and 112b contacting the source and drain regions via contact holes in interlayer insulation layer 110.

A buffer layer 102 may be provided between the substrate 100 and the semiconductor layer 104. A planarization layer 114 may be on the substrate 100 including the TFT.

The OLED may include an anode electrode 116, coupled with the source electrode 112a or the drain electrode 112b through a via hole in the planarization layer 114, an organic emitting layer 120 on the anode electrode 116 in a light emitting region exposed by a pixel definition layer 118, and a cathode electrode 122 on the pixel definition layer 118 including the organic thin layer 120. The organic emitting layer 120 may include a hole transport layer, an organic layer, and an electron transport layer, and may further include a hole injection layer and an electron injection layer.

The UV light shielding layer 130 may include layers of materials having different absorption wavelengths. For example, the UV light shielding layer 130 may include a material 130a absorbing UV light of a first wavelength, a material 130b absorbing UV light of a second wavelength, and a material 130c absorbing UV light of a third wavelength. These layers may be laminated. While a three layer structure having different UV light absorbing wavelengths is shown in the FIG. 3, embodiments are not limited thereto. For example, a multi-layer structure of no less than two layers may be formed. In order to shield of light over a wide wavelength range, the second wavelength may be larger than the third wavelength, the first wavelength may be larger than the second wavelength, and the first, second, and third wavelengths may each be a single wavelength, a plurality of wavelengths, or a range of wavelengths, in accordance with a material.

The encapsulation layer 140 may include an organic film 140a and an inorganic film 140b or the inorganic film 140b and the organic film 140a, which may be laminated. Although only a dual layer of the organic film 140a and the inorganic film 140b is depicted in FIG. 3, embodiments are not limited thereto. For example, the encapsulation layer 140 may be a multi-layer structure having more than two layers.

Hereinafter, a method of fabricating the OLED according to embodiments will be described in detail with reference to FIGS. 4A to 4D and 5A to 5E.

FIGS. 4A to 4D illustrate cross-sectional views of stages in a method of fabricating the organic light emitting display according to the first embodiment of the present invention.

Figure 4A:
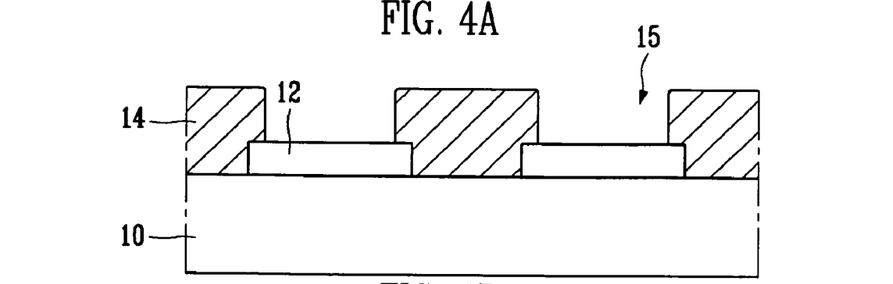
FIGS. 4A to 4D illustrate cross-sectional views of stages in a method of fabricating the organic light emitting display according to the first embodiment of the present invention.

Referring to FIG. 4A, anode electrodes 12 may be arranged on the substrate 10 in the first direction. Insulation material, e.g., organic or inorganic material, may be provided on the entire surface of the substrate 10 having the anode electrodes 12 thereon, and may be patterned to form openings 15 to expose the anode electrodes 12 in the light emitting region, forming the insulation layer 14.

Figure 4B:
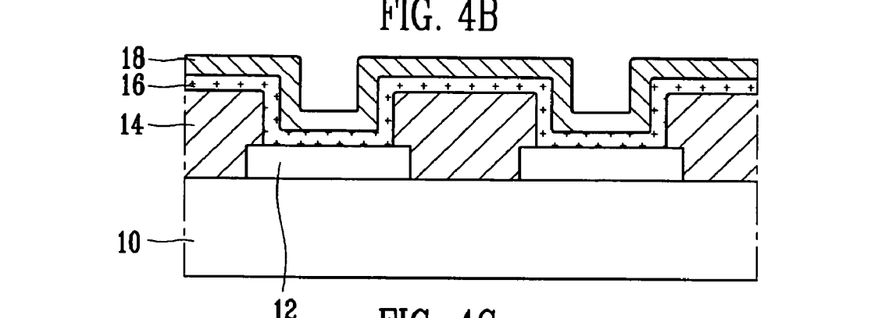

Referring to FIG. 4B, partitions (not shown) may be formed on the insulation layer 14 in the second direction, orthogonal to the first direction and crossing the anode electrodes 12. The organic emitting layer 16 may be formed on the insulation layer 14 including the anode electrodes 12. The cathode electrodes 18 may be formed to cross the anode electrodes 12 in the light emitting region. In this case, the organic emitting layer 16 and the cathode electrodes 18 may be separated by the partitions.

Figure 4C:
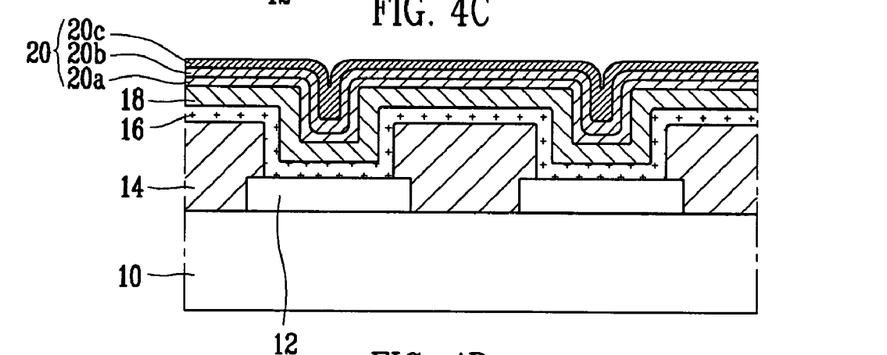

Referring to FIG. 4C, the UV light shielding layer 20 may include the material 20a absorbing UV light of the first wavelength, the material 20b absorbing UV light of the second wavelength, and the material 20c absorbing UV light of the third wavelength, all of which may be laminated on the cathode electrode 18.

Figure 4D:
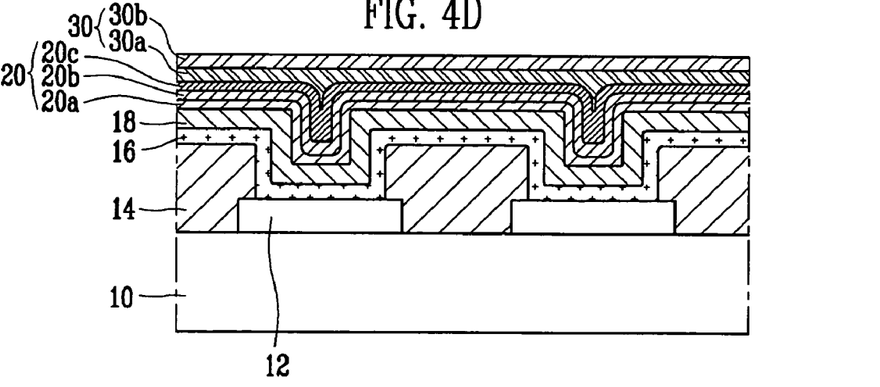

Referring to FIG. 4D, the encapsulation layer 30 including the organic film 30a and the inorganic film 30b may be formed on the UV light shielding layer 20. The order of the films of the encapsulation layer 30 may be reversed. The organic film 30a may planarize an underlying surface and the inorganic film 30b may prevent moisture or oxygen from permeating the encapsulation layer 30. The organic film 30a may be made of UV curable material. For example, a liquid monomer may be vapor-deposited and cured by UV light having a wavelength of, e.g., about 200 nm to about 400 nm.

FIGS. 5A to 5E illustrate cross-sectional views of stages in a method of fabricating the organic light emitting display according to the second embodiment of the present invention.

Figure 5A:
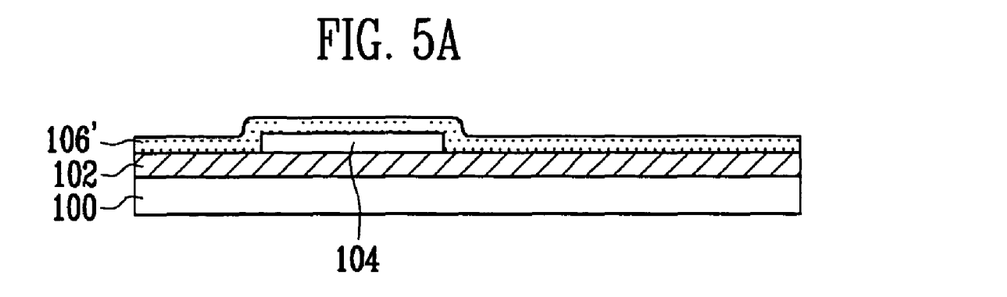
FIGS. 5A to 5E illustrate cross-sectional views of stages in a method of fabricating the organic light emitting display according to the second embodiment of the present invention.

Referring to FIG. 5A, the buffer layer 102 may be formed on the substrate 100, and the semiconductor layer 104, including the channel region and the source and drain regions, may be formed on the buffer layer 102. The insulation material 106' may be formed on the buffer layer 102 including the semiconductor layer 104.

Figure 5B:
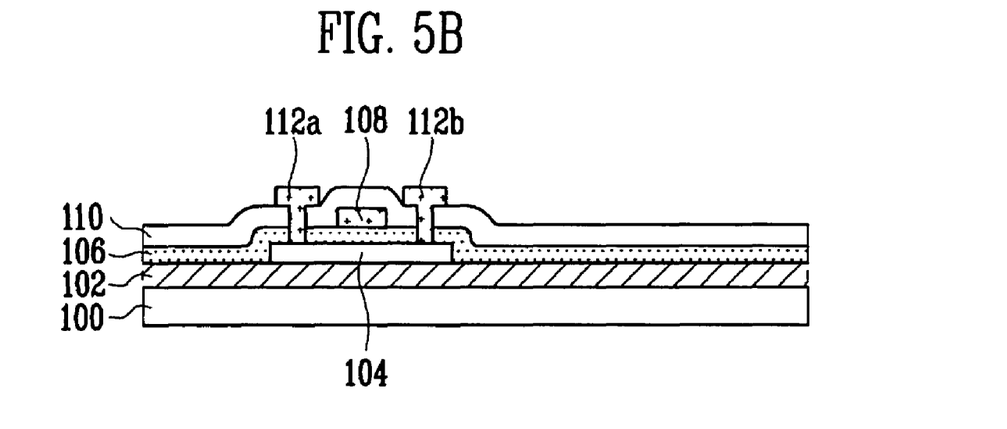

Referring to FIG. 5B, the gate electrode 108 may be formed on the insulation material 106' on the semiconductor layer 104 and interlayer insulation material may be formed on the insulation material layer 106' including the gate electrode 108. The interlayer insulation material and the insulation material 106' may be patterned to form contact holes such that portions of the semiconductor layer 104 are exposed to allow the source and drain electrodes 112a and 112b to contact the semiconductor layer 104, thereby forming the interlayer insulation 110 and the insulation layer 106.

Figure 5C:
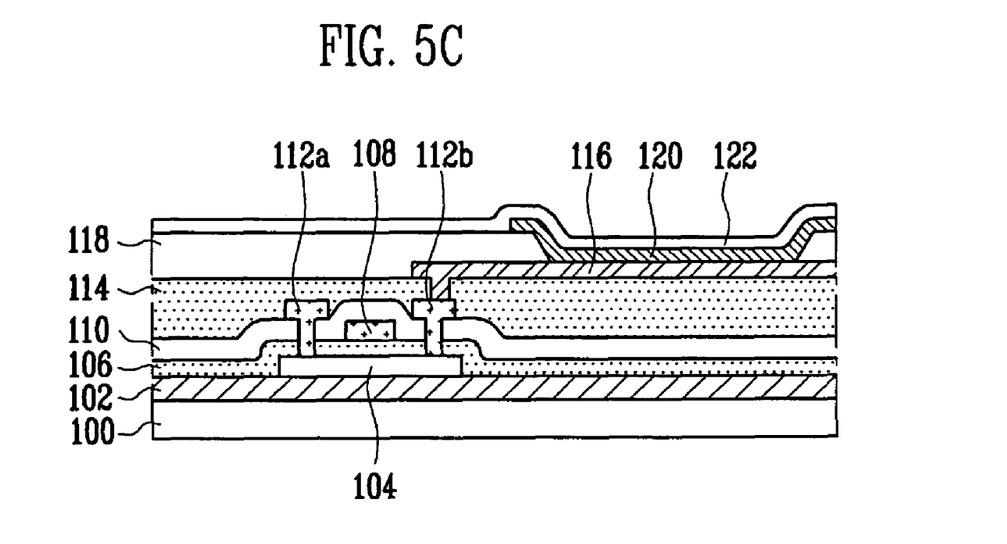

Referring to FIG. 5C, a planarization material may be formed on the entire upper surface to flatten the surface and may be patterned to form the planarization layer 114 including a via hole such that a portion of the source or drain electrode 112a or 112b may be exposed. The anode electrode 116 coupled with the source or drain electrode 112a or 112b through the via hole formed. The pixel definition layer 118 may be formed on the planarization layer 114 such that the anode electrode 116 in the light emitting region is exposed. The organic emitting layer 120 may be formed on the exposed anode electrode 116 and the cathode electrode 122 may be formed on the pixel definition layer 118 including the organic emitting layer 120.

Figure 5D:
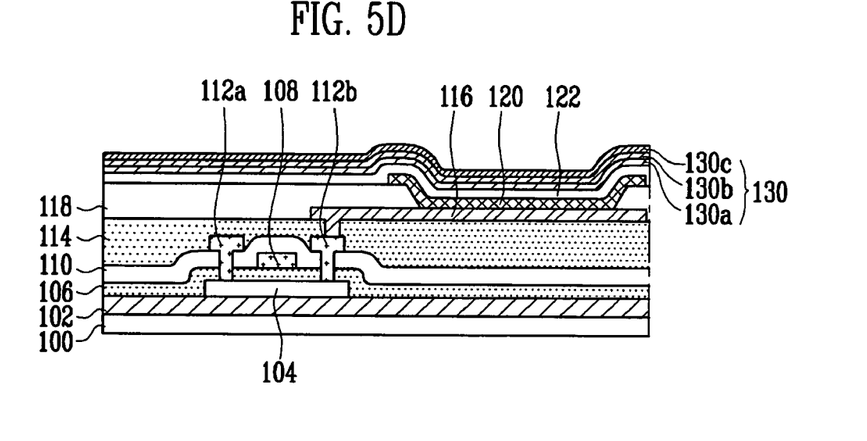

Referring to FIG. 5D, substances that absorb different UV wavelengths, e.g., the material 130a absorbing UV light of the first wavelength, the material 130b absorbing UV light of the second wavelength, and the material absorbing UV light of the third wavelength, may be laminated to form the UV light shielding layer 130.

Figure 5E:
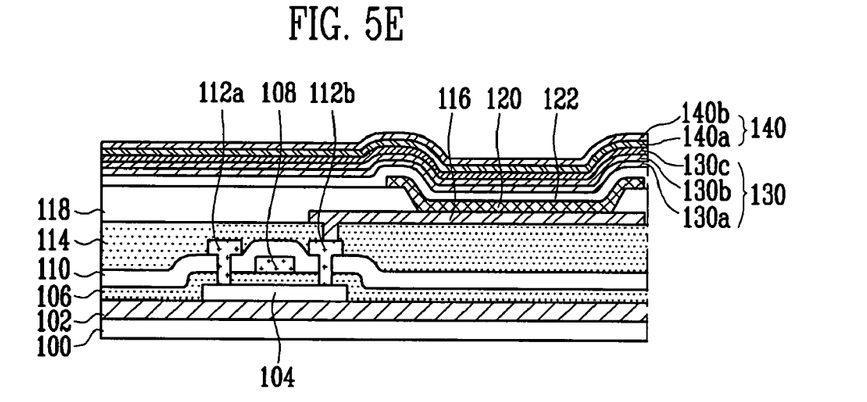

Referring to FIG. 5E, the encapsulation layer 140 including the organic layer 140a on the inorganic layer 140b, or the inorganic layer 140b on the organic layer 140a, may be formed on the UV light shielding layer 130. The organic layer 140a may serve to flatten a surface and the inorganic layer 140b may prevent moisture and oxygen from permeating the encapsulation layer 140. The organic layer 140a may include a UV curable material. For example, a liquid monomer may be vapor-deposited and cured by UV light having a wavelength of, e.g., about 200 nm to about 400 nm.

As described above, embodiments form the UV light shielding layers 20 and 130 on the organic light emitting device. In a process of forming the organic layers 30a and 140a and hardening the organic layers 30 and 140a by UV light in order to form the encapsulation layers 30 and 140, the UV shielding layers 20 and 130 prevent UV light from being incident on the OLED. Since the UV light shielding layers 20 and 130 according to embodiments have a laminated structure of substances absorbing different UV wavelengths, e.g., the lower layer absorbing a lower UV wavelength than the upper layer, UV light over a wider wavelength range may be more effectively shielded than may be realized using a single layer structure.

When the organic layers 30a and 140a are hardened by the UV wavelengths about 200 nm to about 400 nm, the substances having different UV absorbing wavelengths may be selected from, e.g., resorcinol monobenzoate, absorbing wavelengths of about 225 nm and about 275 nm, benzophenone, absorbing wavelengths of about 252 nm, benzotriazole, absorbing wavelengths of about 254 nm, about 259 nm, and about 276 nm, cinnamate, absorbing wavelengths of about 284 nm, oxanilide, absorbing wavelengths of about 280 nm to about 320 nm, and salicylate absorbing wavelengths above that of the wavelength range absorbed by oxanilide.

Figure 6:
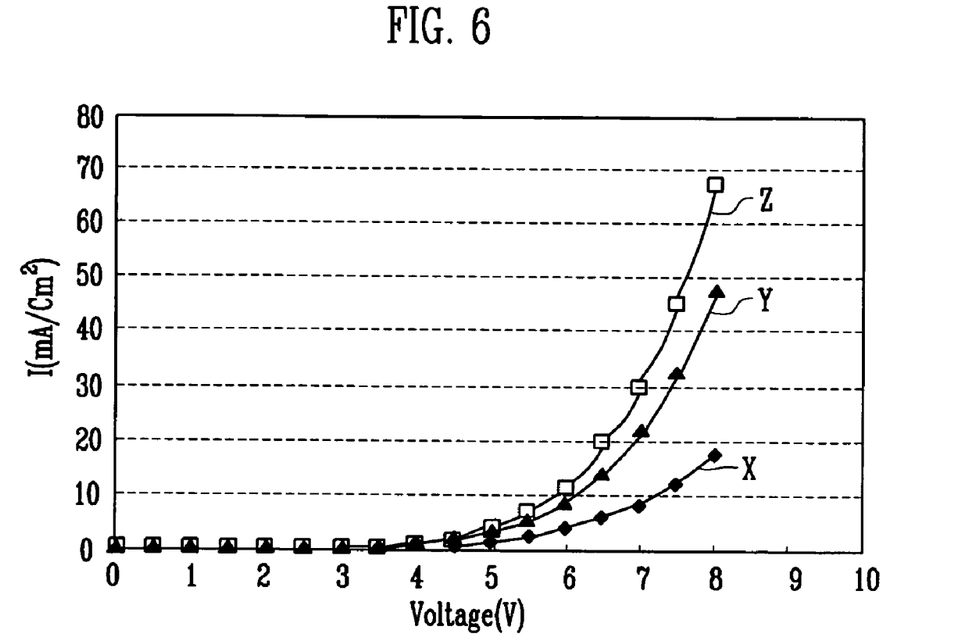
FIG. 6 illustrates a graph of an effect of a UV light shielding layer according to an embodiment of the present invention.

FIG. 6 illustrates a graph of UV light shielding effect of an UV light shielding layer according to an embodiment. Curve X illustrates a conventional case in which there is no UV light shielding layer, curve Y illustrates a case in which a UV light shielding layer is a single layer, and curve Z illustrates a case in which the UV light shielding layer is a multilayer structure. As illustrated in FIG. 6, according to an embodiment, the UV light shielding layer having the multi-layer structure completely shields the OLED, so that the electrical characteristic of the OLED emitting device do not deteriorate.

As described above, substances having different UV light absorbing wavelengths may be provided on the OLED to form the UV light shielding layer, and UV light used to form the encapsulation layer may be blocked by the UV light shielding layer. Therefore, the electrical characteristic of the OLED may be maintained, i.e., defects in the organic emitting layer arising from exposure to UV light may be reduced or prevented, so that the brightness characteristic and life of the organic light emitting display may be improved.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display, comprising:
   a substrate;
   an organic light emitting device on the substrate, the organic light emitting device including a first electrode, an organic emitting layer, and a second electrode;
   a UV light shielding layer on the organic light emitting device, the UV light shielding layer including at least a first UV light shielding layer and a second UV light shielding layer sequentially stacked on the organic light emitting device, the first and second UV light shielding layers being discrete layers, and the first UV light shielding layer absorbing a first wavelength of UV light and the second UV light shielding layer absorbing a different second wavelength of UV light, the first wavelength being longer than the second wavelength; and
   an encapsulation layer on the UV light shielding layer sealing the organic light emitting device.

2. The organic light emitting display as claimed in claim 1, wherein the first UV light shielding layer includes at least one of resorcinol monobenzoate, benzophenone, benzotriazole, cinnamate, oxanilide, and salicylate, and the second UV light shielding layer includes a different one of resorcinol monobenzoate, benzophenone, benzotriazole, cinnamate, oxanilide, and salicylate.

3. The organic light emitting display as claimed in claim 1, wherein the encapsulation layer includes a UV curable material, the UV curable material being curable by UV light having a wavelength between about 200 nm to about 400 nm, and the first and second UV light shielding layers absorbing different wavelengths of UV light between about 200 nm to about 400 nm.

4. The organic light emitting display as claimed in claim 1, wherein the encapsulation layer includes an organic film and an inorganic film.

5. The organic light emitting display as claimed in claim 1, further comprising a thin film transistor on the substrate and coupled with the first electrode.

6. The organic light emitting display as claimed in claim 1, wherein the UV light shielding layer further includes a third UV light shielding layer, the third UV light shielding layer being a discrete layer from the first and second UV light shielding layers, and the first and second UV light shielding layers absorbing different wavelengths of UV light than the third UV light shielding layer.

7. A method of fabricating an organic light emitting display, comprising:
   forming an organic light emitting device on a substrate, the organic light emitting device including a first electrode, an organic emitting layer, and a second electrode;
   forming a UV shielding layer on the organic light emitting device, the UV light shielding layer including at least a first UV light shielding layer and a second UV light shielding layer sequentially stacked on the organic light emitting device, the first and second UV light shielding layers being discrete layers, and the first UV light shielding layer absorbing a first wavelength of UV light and the second UV light shielding layer absorbing a different second wavelength of UV light, the first wavelength being longer than the second wavelength; and
   forming an encapsulation layer on the UV shielding layer sealing the organic light emitting device.

8. The method as claimed in claim 7, wherein the first UV light shielding layer includes at least one of resorcinol monobenzoate, benzophenone, benzotriazole, cinnamate, oxanilide, and salicylate, and the second UV light shielding layer includes a different one of resorcinol monobenzoate, benzophenone, benzotriazole, cinnamate, oxanilide, and salicylate.

9. The method as claimed in claim 7, wherein forming the encapsulation layer includes UV curing a UV light curable material, the UV curable material being curable by UV light having a wavelength between about 200 nm to about 400 nm, and the first and second UV light shielding layers absorbing different wavelengths between about 200 nm to about 400 nm.

10. The method as claimed in claim 7, wherein forming the encapsulation layer includes forming an organic film and an inorganic film.

11. The method as claimed in claim 10, wherein forming the organic film and the inorganic film includes laminating the inorganic film on the organic film.

12. The method as claimed in claim 7, wherein forming the UV shielding layer includes laminating the first UV light shielding layer on the second electrode and laminating the second UV light shielding layer on the first UV light shielding layer.

13. The method as claimed in claim 7, further comprising forming a thin film transistor on the substrate, the thin film transistor being coupled to the organic light emitting device.

14. The method as claimed in claim 13, wherein forming the thin film transistor includes:
    forming a semiconductor layer on the substrate;
    forming a gate insulation layer on the substrate including the semiconductor layer;
    forming a gate electrode on the gate insulation layer and the semiconductor layer;
    forming an interlayer insulation layer on the gate electrode and the gate insulation layer, the interlayer insulation layer including contact holes exposing the semiconductor layer;
    forming source and drain electrodes contacting the semiconductor layer through the contact holes; and
    forming a via hole to expose the source electrode or the drain electrode after forming a planarization layer on the entire upper surface; and, wherein, forming the organic light emitting device includes:
    forming a first electrode coupled with the source electrode or the drain electrode through the via hole;
    exposing the first electrode of a light emitting region after forming a pixel definition layer on the entire upper surface; and
    forming an organic emitting layer on the exposed first electrode and forming a second electrode on the pixel definition layer including the organic emitting layer.

15. The method as claimed in claim 7, wherein forming the organic light emitting device includes:
    forming first electrodes arranged on a substrate in a first direction;
    forming an insulation layer including openings such the first electrode in a light emitting region is exposed;
    forming an organic emitting layer on the insulation layer including the first electrodes; and
    forming a second electrode crossing the first electrodes of the light emitting region.

* * * * *